United States Patent [19]

Sagawa et al.

[11] Patent Number: 4,679,003
[45] Date of Patent: Jul. 7, 1987

[54] FREQUENCY DIVIDER CIRCUIT AND FREQUENCY SYNTHESIZER USING THE SAME

[75] Inventors: Morikazu Sagawa, Hachioji; Yoshikazu Mori; Motoi Ohba, both of Kawasaki; Mitsuo Makimoto, Yokohama; Sadahiko Yamashita, Sagamihara, all of Japan

[73] Assignee: Matsushita Electric Industrial Co., Ltd., Osaka, Japan

[21] Appl. No.: 905,262

[22] Filed: Sep. 9, 1986

Related U.S. Application Data

[62] Division of Ser. No. 709,288, Mar. 7, 1985.

[30] Foreign Application Priority Data

Mar. 9, 1984 [JP] Japan ................................. 58-45802
Mar. 9, 1984 [JP] Japan ................................. 59-45803
Jul. 27, 1984 [JP] Japan ................................. 59-157827

[51] Int. Cl.⁴ ............................................. H03L 7/04
[52] U.S. Cl. ................................. 331/1 A; 307/219.1; 328/16; 331/25; 375/120; 377/47; 455/120
[58] Field of Search ..................... 331/1 A, 17, 25, 51; 375/120; 455/260

[56] References Cited

U.S. PATENT DOCUMENTS 4,392,253  7/1983  Yamada et al. ................. 331/1 A X
4,631,496 12/1986  Borras et al. ........................ 331/1 A

*Primary Examiner*—Eugene R. LaRoche
*Assistant Examiner*—James C. Lee
*Attorney, Agent, or Firm*—Spencer & Frank

[57] ABSTRACT

A wide band analog frequency divider circuit operable at a high frequency in the GHz band, and a frequency synthesizer utilizing the analog frequency divider circuit. The analog frequency divider circuit comprises an LC series circuit having a capacitor and an inductor connected between the anode and the cathode of a diode, and means for applying a forward bias to the diode. The input signal is supplied from the anode side of the diode, and the output is delivered from the cathode side, or the anode side of the cathode is grounded. The frequency synthesizer is arranged to frequency divide the output of a VCO by the analog frequency divider circuit, and to supply the frequency-divided output to a prescaler. The output of the prescaler is further frequency divided by a programmable divider, and the phase difference between the output of the programmable divider and a reference signal is detected thereby to control the oscillation frequency of the VCO.

14 Claims, 35 Drawing Figures

FREQUENCY DIVIDER CIRCUIT AND FREQUENCY SYNTHESIZER USING THE SAME

This is a division of application Ser. No. 709,288 filed Mar. 7, 1985.

BACKGROUND OF THE INVENTION

The present invention relates to an analog frequency divider circuit which is operable stably to a high frequency in the gigahertz (GHz) band, and further relates to a frequency synthesizer using a frequency divider circuit.

Conventionally, a digital frequency divider circuit employing a flip-flop (abbreviated as F/F) has been widely used as a frequency divider indispensable for the PLL (phase-locked loop) which is used to stabilize the local oscillator source in automobile telephones and various radio equipments. In this digital frequency divider circuit, for example, a synchronous type master-slave F/F is used. However, the digital frequency divider circuit of such a configuration is composed of numerous transistors and diodes, and thus the circuit structure is complicated. Furthermore, since the maximum operating frequency is about 1 GHz in the case where Si is used, and about several GHz where GaAs is used, difficulties not only arise in manufacturing the frequency divider circuit when it is desired to operate in a range extending to a higher frequency, but power consumption increases to a great extent. These are disadvantageous in this type of frequency divider circuit. For this reason, with increasing requirements for higher utilizable frequencies and for lower power consumption, analog frequency divider circuits also have been utilized.

As an analog frequency divider circuit for high frequencies, a so-called feedback frequency divider circuit is used in which, where $f_1$ is an input frequency, $f_2$ is a frequency-divided output frequency, and n is the frequency-dividing ratio, the input frequency $f_1$ and the (n-1)th higher harmonic of the output frequency $f_2$ are applied to a modulator and the difference frequency therebetween is outputted. In this type of analog frequency divider circuit, there are drawbacks in that since the harmonic oscillator is always oscillating, an undesired wave is possibly outputted even when there is no input signal, and further the operating frequency band is also narrow.

Furthermore, in a conventional frequency synthesizer using the frequency divider circuit there is a drawback in that, as the oscillation frequency becomes high, the frequency divider circuit in the prescaler is required to be operated at high speeds, electric power consumption increases, and the operating margin is lost resulting in poor stability. Therefore power consumption of the synthesizer remarkably increases, and unstable operation cannot be avoided.

SUMMARY OF THE INVENTION

This invention was made to solve the drawbacks in the conventional circuits described in the foregoing, and it is an object of the present invention to provide an analog frequency divider circuit having a simple construction and small power consumption, and which is operable stably over a wide band in a high frequency range of the GHz band.

It is another object of the present invention to provide a frequency synthesizer utilizing the frequency divider circuit mentioned above.

In a frequency divider circuit according to the present invention, the above-mentioned object is achieved by adding an LC series circuit consisting of a capacitor and an inductor between the anode and cathode of a diode in parallel with the diode. The diode is biased forwardly and the input signal is fed from the anode side. On the other hand, the output is delivered from the cathode side, or from the anode when the cathode is grounded.

Furthermore, in a frequency synthesizer according to the present invention, the output of a VCO is supplied to a prescaler after being frequency divided by a frequency divider circuit having the configuration mentioned above. A programmable divider further frequency divides the output of the prescaler, and by detecting a phase difference between the frequencydivided output and a reference signal, the oscillation frequency of the VCO is controlled.

DESCRIPTION OF THE PREFERRED EMBODIMENTS

Figure 1:
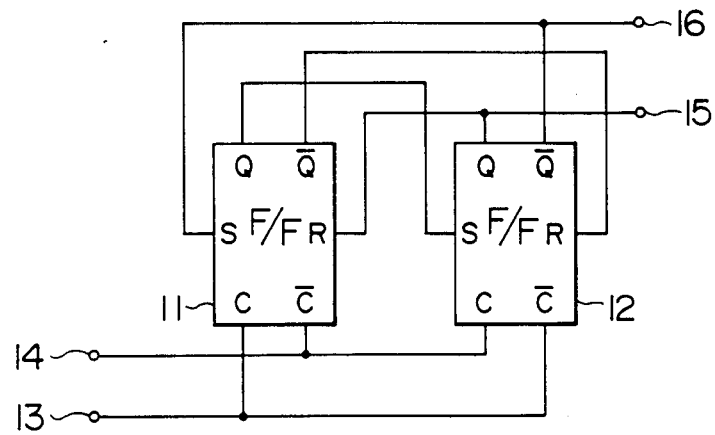
FIG. 1 is a block diagram of a conventional digital frequency divider circuit employing a flip-flop.
Figure 2:
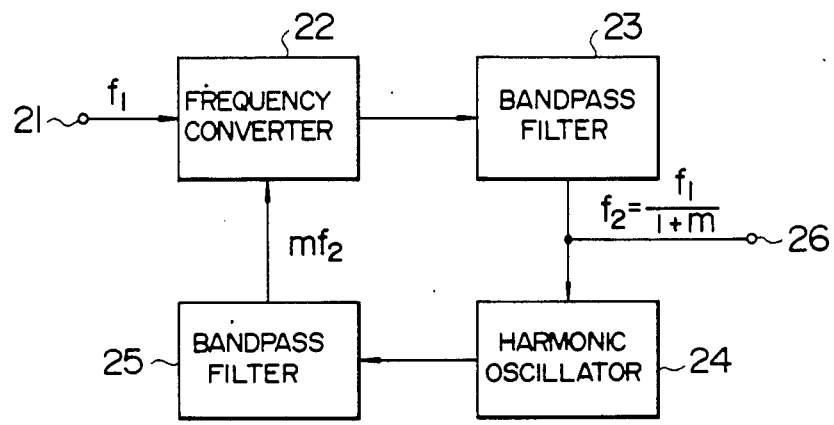
FIG. 2 is a block diagram of a conventional analog frequency divider circuit.
Figure 3:
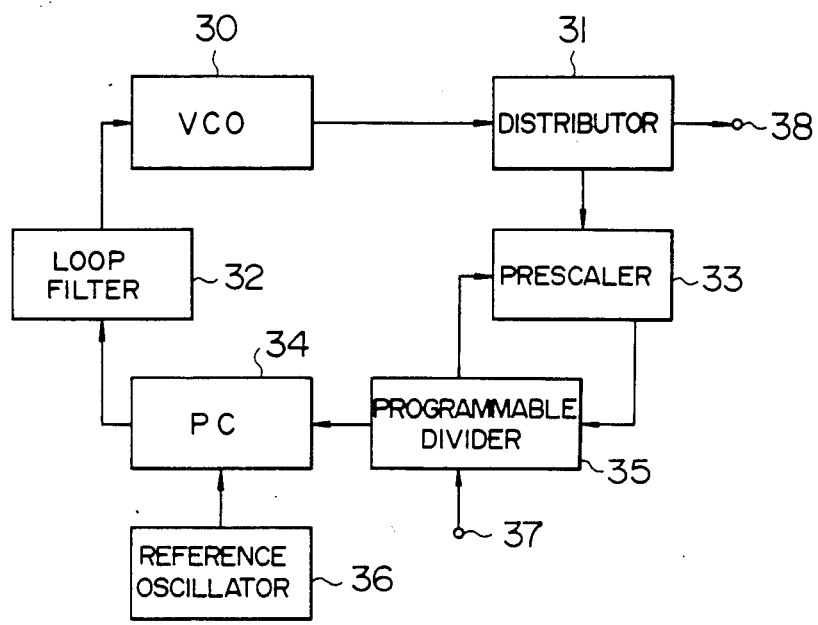
FIG. 3 is a block diagram showing an example of a conventional frequency synthesizer.

Before describing the present invention, in order to assist understanding the present invention, a conventional frequency divider circuit and a frequency synthesizer will be described with reference to the drawings (FIGS. 1, 2 and 3).

FIG. 1 shows a block diagram of a conventional digital frequency divider circuit employing an F/F. In this respect, the frequency divider circuit shown in FIG. 1 uses a master-slave F/F consisting of set-reset F/Fs 11 and 12.

Numeral 13 designates a clock terminal, 14 a reverse phase clock terminal, and 15 and 16 designate respectively a positive phase output terminal and a reverse phase output terminal. And set(S) and reset(R) terminals of the master F/F 11 are respectively connected to reverse phase ($\overline{Q}$) and positive phase (Q) terminals of the slave F/F 12, and on the other hand, Q and $\overline{Q}$ terminals of the master F/F 11 are respectively connected to S and R terminals of the slave F/F 12. Further, clock (C) and reverse phase clock ($\overline{C}$) terminals of the master F/F 11 are respectively connected to $\overline{C}$ and C terminals of the slave F/F 12. In the configuration mentioned above, upon supplying a clock signal to the clock terminal 13, and a reverse phase clock signal or a fixed reference voltage to the reverse phase clock terminal 14, then each time the clock signal rises, the output of the slave F/F 12 is inverted, and the output frequency thereof becomes ½ the clock frequency, and this circuit operates as a binary frequency divider (producing a frequency of ½ the input frequency).

However, the frequency divider circuit of such a configuration is, as described in the foregoing, comprised of numerous transistors and diodes, and hence the circuit structure is complicated, and further there is a difficulty in operating at high frequencies, and power consumption increases.

FIG. 2 shows a block diagram of a conventional feedback frequency divider circuit. Numeral 21 designates an input signal terminal, 26 an output signal terminal, 22 a frequency converter, 23 a bandpass filter, 24 a harmonic oscillator, and 25 designates a bandpass filter.

In this configuration, among the output signals of the harmonic oscillator 24, a signal of a predetermined frequency $mf_2$ (m is an integer) is obtained by the bandpass filter 25, and by applying this signal to the frequency converter 22 together with an input signal of a frequency $f_1$, signals having converted output frequencies $f_1 \pm mf_2$ are obtained. From these signals, a signal of a frequency $f_1 - mf_2$ is taken out through the bandpass filter 23. Since this frequency is equal to the input frequency $f_2$ of the harmonic oscillator 24, at the output terminal 26, an output of a frequency $f_2 = f_1/1 + m$ can be obtained. If m is selected as 2 (m=2), then an output having a frequency of ⅓ the input frequency $f_1$ (frequency dividing by 3) is obtained.

However, in the above-mentioned configuration, since the harmonic oscillator 24 oscillates even when no input signal is applied, there is a drawback in that undesired waves are delivered from the output terminal 26. Furthermore, since the harmonic oscillator 24 performs synchronized oscillation, there is a drawback in that the frequency band operable as a frequency divider circuit is narrowed.

A conventional frequency synthesizer employing the above-mentioned frequency divider circuits will be described in detail. This frequency synthesizer also involves problems in that power consumption increases, the operation margin is deteriorated, and operation is unstable.

Referring to FIG. 3, the output of a voltagecontrolled oscillator (VCO) 30 is divided into two signals by a distributor 31; one is supplied to an output terminal 38 and the other is supplied to a prescaler 33. The output of the VCO 30 inputted to the prescaler 33 is frequency divided by the prescaler 33 and by a programmable divider 35 which operates to frequency divide in accordance with a frequency setting signal applied to a terminal 37. The output of the programmable divider 35 is inputted to a phase comparator (PC) 34 together with the output of a reference oscillator 36 such as a temperature compensated crystal oscillator, and at the output of the PC 34, a voltage proportional to the phase difference between the two input signals is obtained. Then, the AC components of the voltage signal are removed by a loop filter 32 leaving only the DC component, and the DC component is applied to the VCO 30 to control the oscillation frequency. This operation is repeated until there is no phase difference remaining between the two signals inputted to the PC 34, and the oscillation frequency of the VCO 30 is locked to a fixed frequency determined by the frequency setting signal applied to the terminal 37. However, in this circuit, a drawback is involved in that since high speed operation is required for the prescaler as the oscillation frequency becomes high, dissipation current is increased, and deterioration of the operating margin results. Accordingly, it is disadvantageous for use in such equipments as mobile radios in which low power consumption and high stability are required.

Hereinafter, with reference to the drawings, a first embodiment of a frequency divider circuit according to the present invention will be described.

Figure 4:
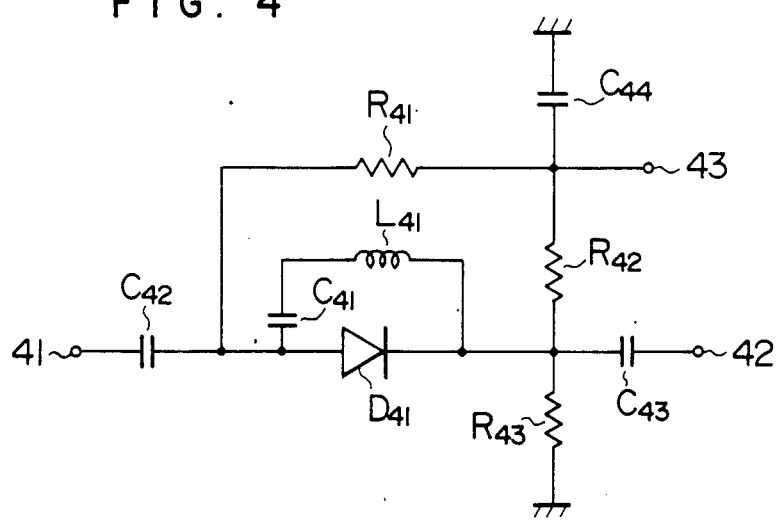
FIG. 4 is a circuit diagram of a first embodiment of a frequency divider circuit according to the present invention.

FIG. 4 shows a circuit diagram of a frequency divider circuit of the first embodiment of the present invention. Numeral 41 designates a signal input terminal, 42 a divided-frequency output terminal, and 43 designates a power supply terminal. Character D41 designates a diode, and a circuit consisting of a capacitor C41 and an inductor L41 is added between the anode and the cathode of the diode D41. C42 and C43 are DC blocking capacitors, C44 is a harmonic bypass capacitor, and R41 and R43 are resistors for supplying a bias voltage.

In the configuration mentioned above, the frequency dividing operation takes place when the diode D41 is biased forwardly.

The diode D41 provides both parametric operation due to a non-linear variation of capacity and mixer operation for maintaining the former operation. When an RF signal of a frequency $2f_0$ is inputted to the diode D41, a subharmonic oscillation of a frequency $f_0$ is produced by the parametric operation, and this oscillation is maintained by a feedback circuit consisting of the capacitor C41 and inductor L41 and by the mixer operation of the diode D41. In other words the divide by 2 operation is performed. Since the frequency dividing operation occurs when the voltage across the terminals of the diode D41 is below a contact potential $\phi_B$, and the subharmonic oscillation stops when no input is supplied, the operation is stable.

The lower the frequency of the input signal, the higher becomes the bias voltage, and as the frequency becomes higher, the bias voltage changes to the lower side. In this respect, even when the bias voltage is high, it is equal to or less than 0.6 V, and the current in this case is very small such as several tens of $\mu A$ (micro amperes). Therefore, since the resistors R41 to R43 for supplying the bias voltage can have a relatively large resistance value, a high frequency choke inductor becomes unnecessary, and thus the circuit can be made smaller, and with lower power consumption.

Figure 5:
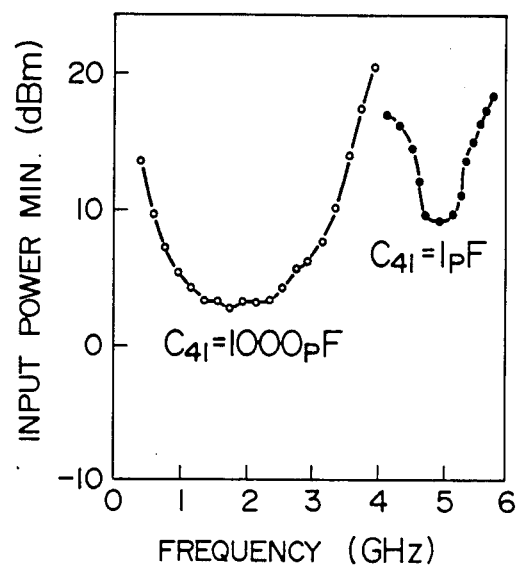
FIG. 5 is a characteristic diagram of the frequency divider circuit of FIG. 4.

FIG. 5 shows the characteristic of the frequency divider circuit of the above-mentioned embodiment. The abscissa represents the input signal frequency and the ordinate represents an input signal power, and the curve indicates the minimum input signal power which enables a frequency-divided output of the divide by 2 operation to be obtained. As will be seen from FIG. 5, depending on the capacity of the capacitor C41, the frequency dividing operation is possible over a wide band ranging from 0.5 GHz to 5 GHz. Furthermore, although the diode D41 used in the frequency divider circuit mentioned above is an inexpensive, mini-mold type switching diode, numerous other diodes such as a PIN diode, varactor diode, etc., may be used. In addition, in order to vary the band in which the frequency dividing operation is attainable, it can be easily achieved by changing the constant of the feedback circuit consisting of the capacitor C41 and inductor L41 or by changing the capacity of the diode D41.

Further, the power consumption decreases as the input frequency becomes higher. This is because when the input frequency is high, the voltage across the terminals of the diode D41 is low, and thus the bias current decreases. Near the maximum operating frequency, the voltage between the terminals is 0 V, and the bias current is below 1 $\mu A$, and at the minimum operating frequency, the voltage between the terminals is 0.6 V, and the bias current is about 10 $\mu A$, and irrespective of this situation, the power consumption is about 6 $\mu W$ and thus very small.

As described in the foregoing, according to the frequency divider circuit shown in FIG. 4, an analog frequency divider circuit with small power consumption can be realized by using an inexpensive diode and a simple configuration even in the high frequency range of the GHz band.

Figure 6:
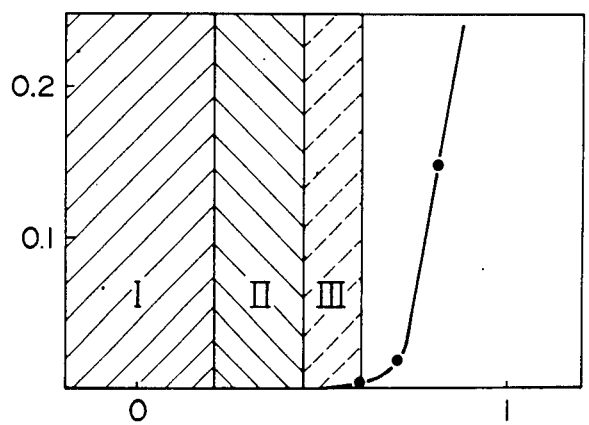
FIG. 6 is a characteristic diagram showing the bias voltage dependency of an operating condition in the frequency divider of FIG. 4.

Furthermore, in the frequency divider circuit described above, the operating conditions can be changed depending on the bias voltage. This is shown in FIG. 6. FIG. 6 is formed by superposing a curve showing the variation of the frequency dividing number with respect to bias voltage at 1 GHz of the input signal frequency on the forward current-voltage characteristic of the diode D41. The area I represents an area of the bias voltage in which no frequency dividing operation takes place, the area II represents an area of the bias voltage in which divide by 2 operation takes place, and the area III represents an area of the bias voltage in which divide by 3 operation takes place. When the bias voltage to be applied is changed from the area I to the area II, the frequency of the output signal changes from the same frequency as the input signal to a frequency of $\frac{1}{2}$ the input frequency, and thus the switching to the divide by 2 operation (the input frequency is divided by 2) is possible. Further, when the bias voltage is changed from the area II to the area III, a change from the divide by 2 to the divide by 3 operation can be achieved, and thus variable frequency dividing operation is possible. Accordingly, by controlling the bias voltage in this manner, the switching of the frequency dividing condition and the variable frequency dividing operation can be achieved simply.

Figure 7:
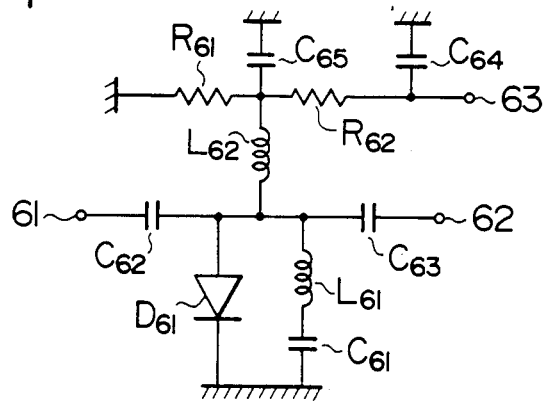
FIG. 7 is a circuit diagram of a second embodiment of a frequency divider circuit according to the present invention.

With reference to FIG. 7, a second embodiment of the present invention will be described.

FIG. 7 shows the circuit diagram of a frequency divider circuit of the second embodiment of the present invention. In the frequency divider circuit shown in FIG. 7, this circuit is inserted in parallel with a signal line. Numerals 61 and 62 designate respectively input-/output terminals, and 63 designates a power supply terminal for setting a bias voltage. D61 designates a diode which has in parallel therewith a feedback circuit consisting of a capacitor C61 and inductor L61, and by grounding the cathode and by applying a bias voltage and an input signal to the anode side, a frequency-divided output is obtained. L62 designates a high frequency choke inductor, C62 and C63 are DC blocking capacitors, C64 and C65 are high frequency bypass capacitors, R61 and R62 are bias voltage supply resistors for applying a forward bias to the diode D61.

In accordance with the configuration mentioned above, since the diode D61 is inserted in parallel with the signal line, there is no directional limitation with respect to the input and output, and thus a signal can be inputted or outputted from either side of the input/output terminals 61 and 62. In addition, there is no particular limitation to the diode D61 to be employed, and a frequency dividing operation characteristic similar to the embodiment of FIG. 4 can be obtained.

According to the embodiment described above, the frequency dividing operation can be attained also by the shunt type in which the diode is connected in parallel with the signal line, as is the case in the series type described in the first embodiment. Further, as compared with the conventional digital type frequency divider circuit using numerous transistors and F/Fs and with the conventional analog type frequency divider circuit, the frequency divider circuit in the present embodiment provides significant features in that the circuit structure is simple since a single diode is employed and further the power consumption is small.

Next, an embodiment employing a matching circuit will be described.

Figure 8:
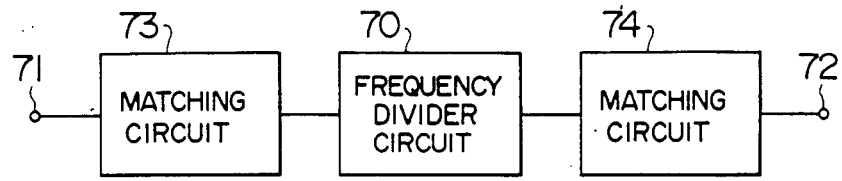
FIGS. 8 and 9A to 9C are block diagrams showing connections of the frequency divider circuit according to the present invention with various external circuits.

FIG. 8 shows a block diagram of a connection of the frequency divider circuit of this invention with external circuits. Numeral 70 designates a frequency divider circuit of either the series type shown in FIG. 4 or the parallel type as shown in FIG. 7, 71 an input signal terminal, and 72 designates a frequency divided output terminal. Numerals 73 and 74 designate respectively matching circuits, and the matching circuit 73 matches to an input signal frequency, and the matching circuit 74 matches to a frequency-divided output frequency. According to the configuration mentioned above, much greater output power can be obtained with much smaller input power. Further, if the input side matching circuit 73 is formed by an HPF (high-pass filter) and the output side matching circuit 74 is formed by an LPF (low-pass filter), it will function as a countermeasure for spurious responses and will be effective.

Another embodiment utilizing various kinds of filters will be described.

Figure 9A:
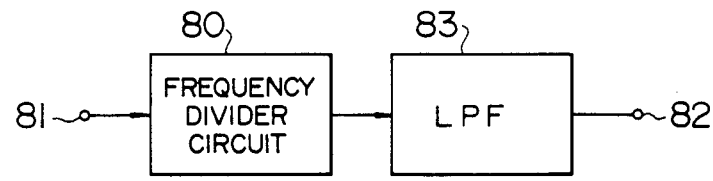
Figure 9B:
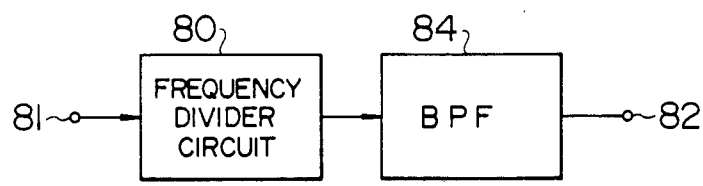
Figure 9C:
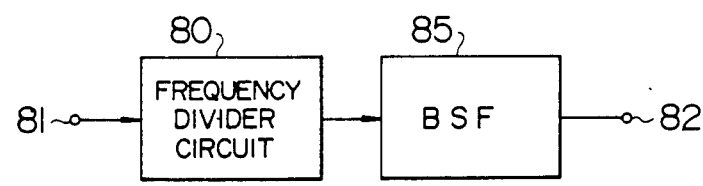

In FIGS. 9A, 9B and 9C, numeral 80 designates a frequency divider circuit of either the series type shown in FIG. 4 or the parallel type shown in FIG. 7, 81 a signal input terminal, and 82 designates a frequency-divided output terminal. And in order to eliminate the leakage of the input signal to the output side and to obtain a good spurious characteristic, in FIG. 9A an LPF (low-pass filter) 83 is added, and in FIG. 9B a BPF (band-pass filter) 84 is added, and in FIG. 9C a BSF (band-stop filter) 85 is added. The cutoff frequency of the LPF 83 is set to be higher than the divided frequency and lower than the input signal frequency. Further, the center frequency of the BPF 84 is set to be the same as the frequency-divided frequency, and the center frequency of the BSF 85 is set to be the same as the input signal frequency. Since these filters 83, 84 and 85 have merits and demerits, it is necessary to select a suitable filter depending on the purpose, for example, where small insert loss is required, the LPF 83 or BSF 85 is used, and where good selectivity is required the BPF 84 is used. In FIGS. 9A, 9B and 9C, although no circuit is connected at the input side, the matching circuit (HPF) shown in FIG. 8 may naturally be added.

Figure 10:
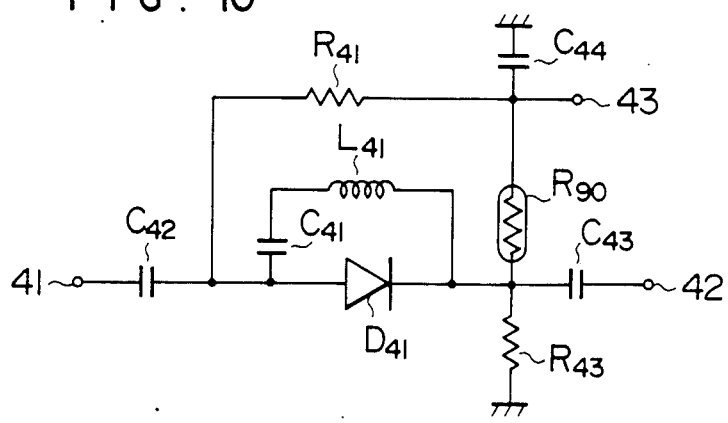
FIGS. 10 and 11 are respectively circuit diagrams of third and fourth embodiments of a frequency divider circuit according to the present invention.

FIG. 10 shows a frequency divider circuit of a third embodiment of the present invention. In FIG. 10, the difference from the series type frequency divider circuit shown in the embodiment of FIG. 4 resides in that a temperature-dependent resistor 90 is employed in the circuit for supplying the bias voltage in order to ensure stable operation irrespective of a temperature variation. Further, in FIG. 10, circuit elements having identical reference numerals to that in FIG. 4 perform identical actions.

In the configuration mentioned above, although the forward characteristic of the diode D41 changes with respect to temperature, in this embodiment a temperature dependent resistor R90 having a negative temperature characteristic (the characteristic in which the resistance value decreases as temperature rises) is used to compensate for the temperature by changing the bias voltage depending on the temperature variation in such a manner that the bias voltage to be applied is decreased as the temperature rises, whereas as the temperature decreases the bias voltage is increased. For this reason the frequency dividing operation can be performed stably. In this embodiment, the description is made with reference to an example of the series type frequency divider circuit shown in FIG. 4. However, it should be appreciated that the parallel type frequency divider circuit shown in FIG. 7 is also applicable. Further, in this embodiment, although the temperature dependent resistor R90 is employed alone to achieve the temperature compensation, fixed resistors may be combined in series or in parallel so that the temperature characteristic of the resistors can be controlled.

Figure 11:
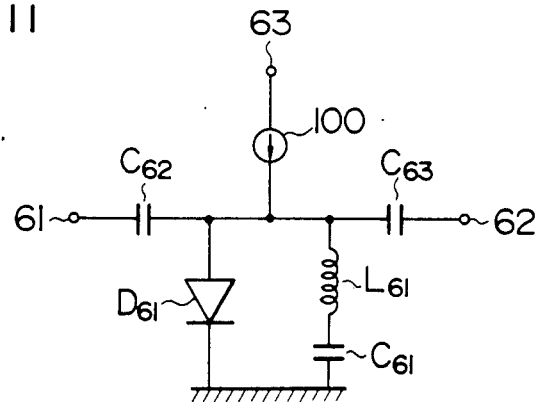

FIG. 11 shows a circuit diagram of a frequency divider circuit of a fourth embodiment of the present invention.

In FIG. 11, the difference from the configuration of the parallel type frequency divider circuit shown in the embodiment of FIG. 7 resides in that a constant current source 100 is newly provided. Further, in FIG. 11, circuit elements having identical reference numerals to that in FIG. 7 perform identical actions.

In the configuration mentioned above, although the forward characteristic of the diode D61 changes with respect to temperature as described in the foregoing, by providing a constant current source 100 which allows a constant current to flow continually irrespective of a temperature variation, the bias voltage is automatically changed and compensated.

Further, in this embodiment, although the parallel type frequency divider circuit has been described, it should be appreciated that it is also applicable to the series type frequency divider circuit.

Figure 12:
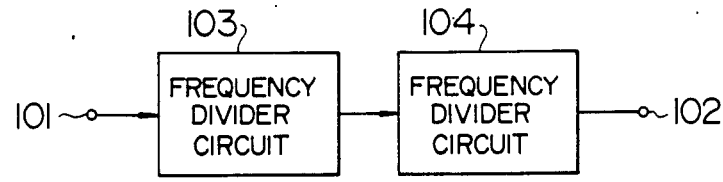
FIG. 12 is a block diagram showing a multistage configuration of a frequency divider circuit according to the present invention.

FIG. 12 shows a block diagram in which frequency divider circuits according to the present invention are connected in a multi-stage form. Numeral 101 designates a signal input terminal, and 102 designates a frequency-divided output. Numerals 103 and 104 designate respectively frequency divider circuits of either the series type or the parallel type shown in FIGS. 4, 7, 10 and 11.

In the configuration mentioned above, by changing the bias voltages of the frequency divider circuits 103 and 104 to control the frequency dividing number, a variable frequency divider circuit can be realized with a simple configuration. For example, the bias voltage of either the first stage frequency divider circuit 103 or the second stage frequency divider circuit 104 is set in an area in which the divide by 2 operation takes place, and when the bias voltage of the other stage frequency divider circuit is switched between one area in which no frequency dividing operation takes place and the other area in which the divide by 2 operation takes place, then it will be possible to achieve a variable frequency dividing operation, that is, dividing by 2 and 4 (integral submultiples $\frac{1}{2}$ and $\frac{1}{4}$). On the other hand, when both the frequency divider circuits 103 and 104 are respectively switched between the two areas, i.e., one area in which no frequency dividing takes place and the other area in which frequency dividing by 2 takes place, a variable frequency dividing by 1, 2 and 4 can be achieved to obtain frequencies of 1/1, and $\frac{1}{4}$ the input frequency. Further, in the frequency divider circuit of this embodiment, although the description is made as to the three kinds of frequency dividing numbers 1, 2 and 4 (integral submultiples 1/1, $\frac{1}{2}$ and $\frac{1}{4}$), a variable frequency divider circuit having other various combinations of the frequency dividing numbers can be realized. Further, in this embodiment, an example of the frequency divider circuit of two stages is described. However, it is apparant that the described example is also applicable to a frequency divider circuit of an arbitrary number of stages.

Figure 13:
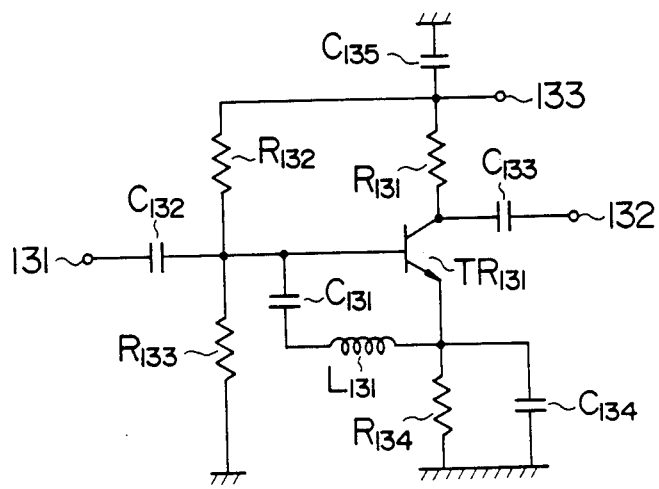
FIG. 13 is a circuit diagram of a fifth embodiment of a frequency divider circuit according to the present invention.

FIG. 13 shows a fifth embodiment of a frequency divider circuit according to the present invention in which a transistor is employed. In FIG. 13, numeral 131 designates a signal input terminal, 132 an output terminal of a frequency-divided signal, and 133 designates a power supply terminal for setting the bias voltage. TR131 designates a transistor, and an LC series circuit consisting of a capacitor C131 and an inductor L131 is added between the base and the emitter. C132 and C133 designate DC blocking capacitors respectively, C134 and C135 are high frequency bypass capacitors, and R131 and R134 designate bias voltage supply resistors respectively.

In the configuration mentioned above, the frequency dividing operation takes place when the diode existing across the base and emitter of the transistor TR131 is forwardly biased, and the lower the frequency of the input signal, the higher becomes the base-emitter voltage, and as the frequency becomes higher, the baseemitter voltage changes to the lower side. Further, since the dissipation current can be determined by the resistors R131 and R134, it is possible to reduce the current to less than several mA. Thus, a frequency divider circuit of small power consumption can be realized with a simple configuration in which only one transistor TR131 is used.

Figure 14:
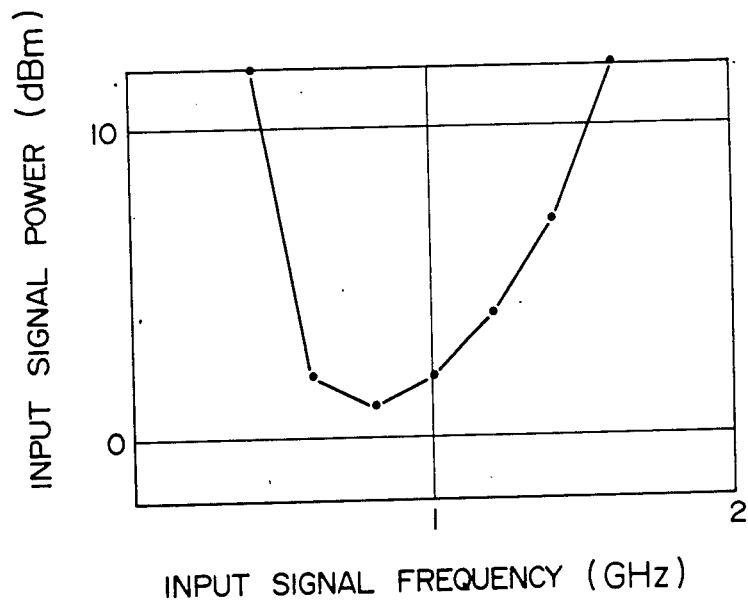
FIG. 14 is a characteristic diagram of the frequency divider circuit of FIG. 13.

FIG. 14 shows the characteristic of the frequency divider circuit having the above-mentioned configuration. The abscissa represents the input signal frequency and the ordinate represents the input signal power, and the curve indicates a minimum input power to enable to obtain a frequency-divided output of a frequency of ½ the input frequency. As will be seen from this characteristic, the frequency dividing operation is possible over a wide band ranging from 0.4 to 1.6 GHz.

Further, in this embodiment, although the value of the inductor L131 is large, the range of the band in which the frequency dividing operation is possible can be changed easily by changing either the constant of the LC series circuit consisting of the capacitor C131 and inductor L131 or the base-emitter capacity of the transistor TR131. In addition, the transistor used in this embodiment is an inexpensive resin mold type transistor having $f_T$ of about 4 GHz ($f_T$=4 GHz), and thus the frequency divider circuit can be operated satisfactorily even with an inexpensive transistor.

Furthermore, by controlling the base-emitter voltage of the transistor TR131, swtiching to the divide by 2 operation to obtain a frequency of ½ the input frequency can be controlled that is, the frequency dividing numbers 1 and 2 (integral submultiples 1/1 and ½) can be controlled. Since the divide by 2 operation takes place when the base-emitter voltage is within a certain range of voltage values, if the base-emitter voltage is set to a voltage below the range, the divide by 2 operation does not take place and the output frequency is the same as the input frequency. Accordingly, if the base-emitter voltage is switched between the two areas (one areas is within the range and the other area is out of the range), the frequency dividing number can be changed between 1 and 2, and thus it is possible to control the frequency dividing number.

Figure 15:
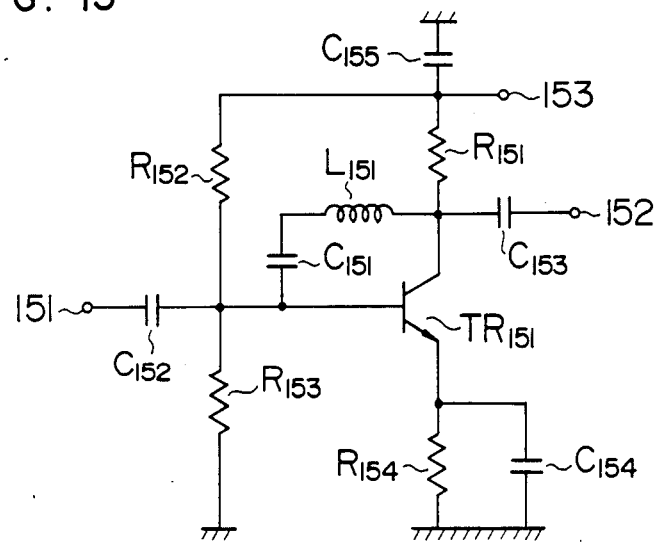
FIGS. 15 and 16 are respectively circuit diagrams of sixth and seventh embodiments of a frequency divider circuit according to the present invention.

FIG. 15 shows a configuration of a frequency divider circuit of the sixth embodiment of the present invention. In FIG. 15, the difference from the configuration of FIG. 13 resides in that the LC series circuit provided between the base and emitter in FIG. 13 is provided between the base and collector in the case of FIG. 15. Further, in FIG. 15, numeral 151 designates a signal input terminal, 152 an output terminal of a frequency-divided signal, 153 a power supply terminal, C152 and C153 respectively DC blocking capacitors, C154 and C155 high frequency bypass capacitors, and R151 to R154 designate respectively bias voltage supply resistors.

In the configuration described above, the frequency dividing operation takes place when the diode across the base and collector of the transistor TR151 is biased forwardly. In other words, the frequency dividing operation occurs when the operating condition of the transistor TR151 is in a saturation condition, and thus a current can be determined by the resistors R151 and R154. The frequency dividing operation is sufficiently possible with a dissipation current of less than several mA, and the frequency dividing operation characteristic is also similar to that of the embodiment shown in FIG. 13.

As described above, this embodiment provides a significant advantage in that the frequency divided output having a frequency of ½ the input frequency can be obtained by forwardly biasing the diode, irrespective of whether the diode is formed between the base and emitter or between the base and collector, and thus the frequency dividing operation can be realized with a simple circuit construction principally comprising a single transistor and further with small power consumption.

Figure 16:
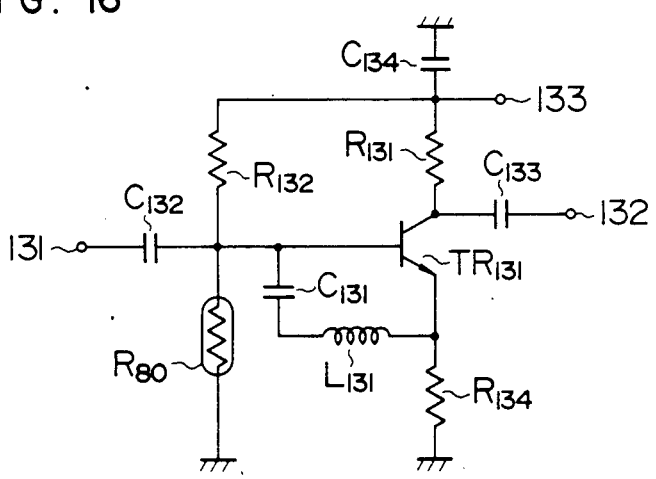

FIG. 16 shows a configuration of a frequency dividing circuit of a seventh embodiment according to the present invention. In this configuration, the difference from the configuration of FIG. 13 resides in that a temperature-dependent resistor R80 is employed in a circuit for supplying the bias voltage in order to attain stable operation regardless of temperature variations. Further in FIG. 16, identical reference numerals to that in FIG. 13 perform identical functions.

In the above described configuration, although the forward characteristic of the diode between the base and emitter changes depending on the temperature, owing to the feedback through an emitter resistor R134, the frequency dividing operation is performed quite stably. However, in order to operate stably irrespective of a further wide range of temperature variation, the temperature variation must be compensated. For this reason, in FIG. 16, a temperature-dependent resistor R80 having a negative temperature characteristic (the characteristic in which the resistance decreases as the temperature rises) is used thereby to cancel out the influence of temperature variations. Although, this embodiment is described in connection with an example wherein a circuit consisting of a capacitor C131 and an inductor L131 is connected between the base and emitter, it is apparent that the description is also applicable to the case in which the circuit is connected between the base and collector. Further, in this embodiment although the temperature compensation is attained with the temperaturedependent resistor R80 alone, fixed resistors may be used by combining in series or in parallel, to control the temperature characteristics of the resistors.

Furthermore, the frequency dividing circuits employing a transistor shown in FIGS. 13, 15 and 16 can be applied to the configurations shown in FIGS. 8, 9 and 12.

Figure 17:
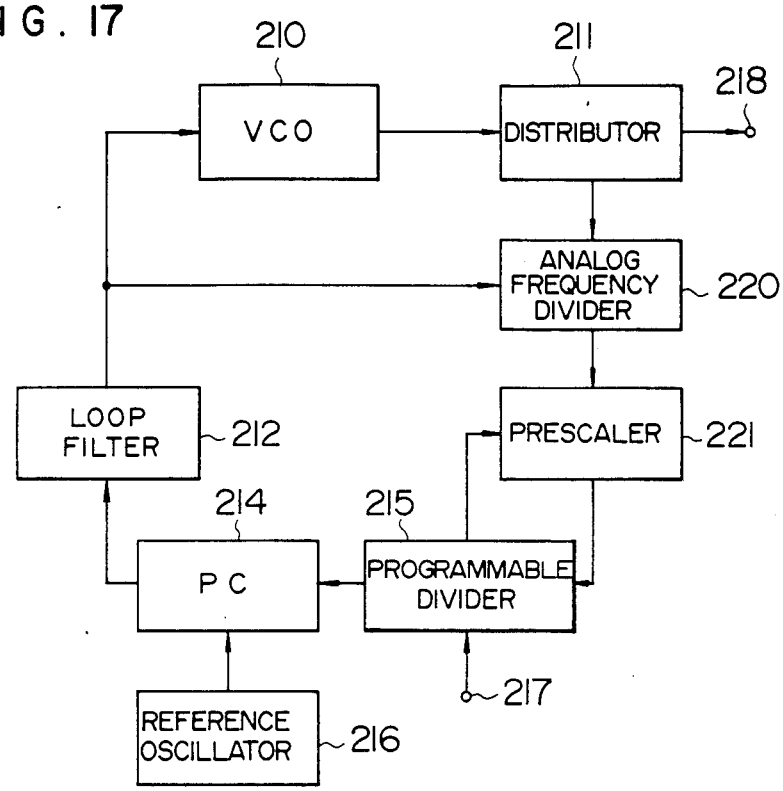
FIG. 17 is a block diagram of an embodiment of a frequency synthesizer according to the present invention.

FIG. 17 shows a block diagram of an embodiment of a frequency synthesizer employing the frequency divider circuits having the configurations described in the foregoing. The output of a VCO 210 is divided into two signals and distributed by a distributor 211 to an output terminal 218 and to an analog frequency divider 220. The analog frequency divider 220 is formed based on the frequency divider circuit of the configuration described in the foregoing so that the capacity of the capacitor constituting the feedback circuit is made variable, and thus the capacity is controllable by the output of a loop filter 212. In other words, this frequency divider 220 utilizes the parametric operation due to the nonlinearity of the diode capacity and the mixer operation to maintain the parametric operation, and this frequency divider 220 operates with small power consumption even in the high frequency range of the GHz band. Since the analog frequency divider 220 takes charge of the high speed operation, the prescaler 221 can eliminate a frequency divider which operates at high speeds and consumes much power, and thus it is possible to reduce the power consumption to a great extent. The output of the prescaler 221 is further frequency divided by a programmable divider 215 which performs the frequency dividing operation in accordance with a frequency dividing number control signal applied to a terminal 217, and the frequency-divided output is phase compared in a PC 214 with the output from a reference oscillator 216 such as a temperature compensation type crystal oscillator. From the output of the PC 214 proportional to the phase difference between these two signals, AC components are removed by the loop filter 212, and then applied to the VCO 210 and to the analog frequency divider 220. The output voltage of the loop filter 212 is determined by the frequency dividing number control signal applied to the terminal 217, and the oscillation frequency of the VCO 210 changes. Further, in the analog frequency divider 220, if the capacity value of the capacitor in the feedback circuit is varied depending on the input frequency so that the capacity value becomes small when the input frequency is high and the capacity value becomes large when the input frequency is low, it is possible to widen the operating frequency range. Accordingly, by adding to the feedback circuit a variable capacity element such as a varactor whose capacity value is varied depending on the applied voltage, and by applying the output voltage of the loop filter 212, a frequency synthesizer operable in a wide band with small power consumption can be realized.

Figure 18:
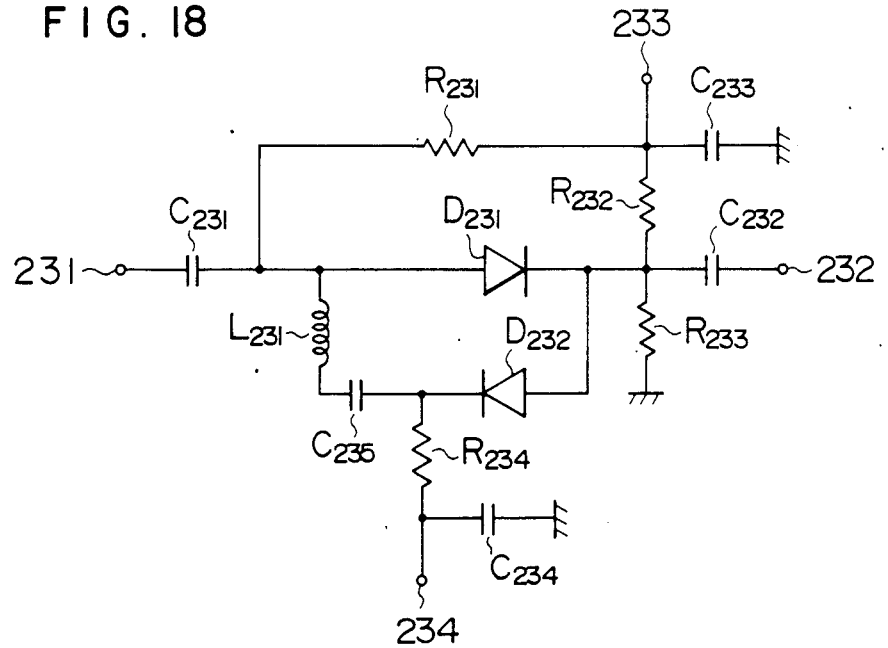
FIGS. 18 to 22 are respectively circuit diagrams of embodiments of an analog frequency divider circuit in the frequency synthesizer of FIG. 17.

FIG. 18 shows another embodiment of an analog frequency divider for performing the operation as described above. Numeral 231 designates a signal input terminal, 232 a frequency-divided output terminal, 233 a power supply terminal for setting bias voltage, and 234 designates a control terminal. The signal input terminal 231 is connected to the output of the distributor 211 of FIG. 17, and the frequency-divided output terminal 232 is connected to the prescaler of FIG. 17, and the control terminal 234 is connected to the output of the loop filter 212 of FIG. 17. Between the anode and cathode of a diode D231, there is added a feedback circuit consisting of an inductor L231, a capacitor C235 and a diode D232, which components constitute the primary section of the frequency divider. C231 and C232 designate DC blocking capacitors respectively, C233 and C234 designate high frequency bypass capacitors respectively, and R231 to R233 designate bias voltage supply resistors respectively. R234 designates a resistor which supplies the output voltage of the loop filter 212 to the diode D232. Depending on the loop filter output voltage applied to the control terminal 234, the capacity value of the diode D232 changes, and the capacity of the feedback circuit which is the combined capacity of the capacity of the diode 232 with a fixed capacity of a capacitor C235 changes. Where the frequency dividing operation over a wide band is required, a diode having a large capacity variation ratio such as a varactor is used, and where such a wide band is not required, a Schottky junction diode or a PN junction diode may be used. As described above, by adding a variable capacity element such as a varactor to the feedback circuit of the frequency divider, and by controlling this by the output voltage of the loop filter 212, a small power consumption frequency synthesizer which operates stably over a wide band can be realized.

Figure 19:
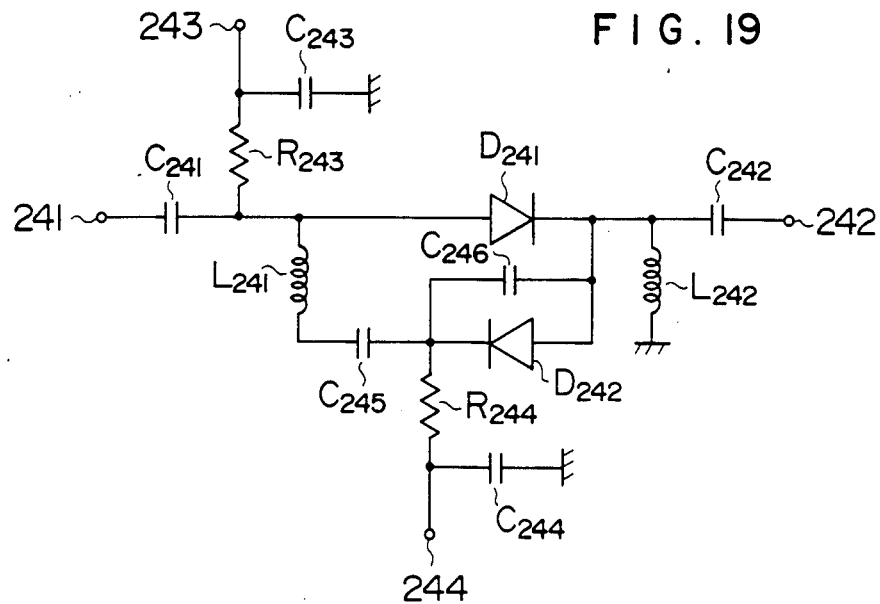

FIG. 19 shows another embodiment of an analog frequency divider which constitutes a frequency synthesizer according to the present invention. Numeral 241 designates a signal input terminal, 242 a frequencydivided output terminal, 243 a bias voltage setting power supply terminal, and 244 designates a control terminal. The manner of connection of respective terminals is the same as in the case of FIG. 18. A diode D241 has a feedback circuit consisting of an inductor L241, capacitors C245 and C246, and diode D242, and the bias voltage is applied through a resistor R243. Capacitors C241 and C242 are DC blocking capacitors, capacitors C243 and C244 are high frequency bypass capacitors, and a resistor R244 is used to supply the output voltage of the loop filter 212 to the diode D242. An inductor L242 is a choke coil for the frequency divided output. In this embodiment, the bias circuit is simplified. In this embodiment, the capacity of the feedback circuit is constituted by capacitors C245 and C246 and the junction capacity of the diode D242. In order to regulate the capacity value variation of the feedback circuit with respect to the output voltage of the loop filter 212, a series capacity may be used as in the embodiment of FIG. 18, or a parallel capacity may be used as in this embodiment.

Figure 20:
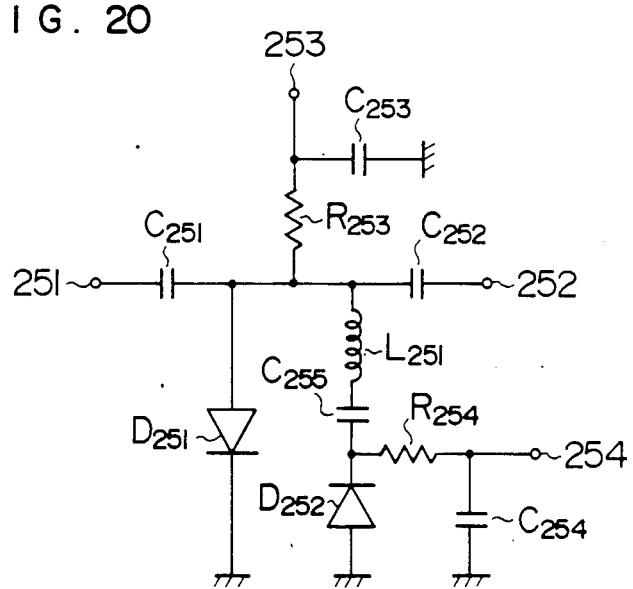

FIG. 20 shows a further embodiment of an analog frequency divider which constitutes a frequency synthesizer of the present invention. This embodiment is an example in which the frequency divider circuit is inserted in parallel with the signal line. Numeral 251 designates a signal input terminal, 252 a frequency-divided output terminal, 253 a bias voltage setting power supply terminal, and 254 designates a control terminal. The manner of connection of respective terminals is the same as in the case of FIG. 18. The diode D251 has a series circuit of an inductor L251, a capacitor C255 and a diode D252 connected in parallel, and the cathode is grounded, and the bias voltage is supplied through a bias resistor R253 to the anode side. Capacitors C251 and C252 are DC blocking capacitors, capacitors C253 and C254 are high frequency bypass capacitors, and a resistor R254 is used to supply the output voltage of the loop filter to the diode D252. In the embodiment, since the diode D251 is inserted in parallel with the signal line, the input and output are not directional, and thus the input and output may be interchanged.

As described in the foregoing, in the analog frequency divider which constitutes the frequency synthesizer of the present invention, the frequency dividing operation is possible over a wide band even when the diode is provided in series with the signal line, and also provided in parallel.

Figure 21:
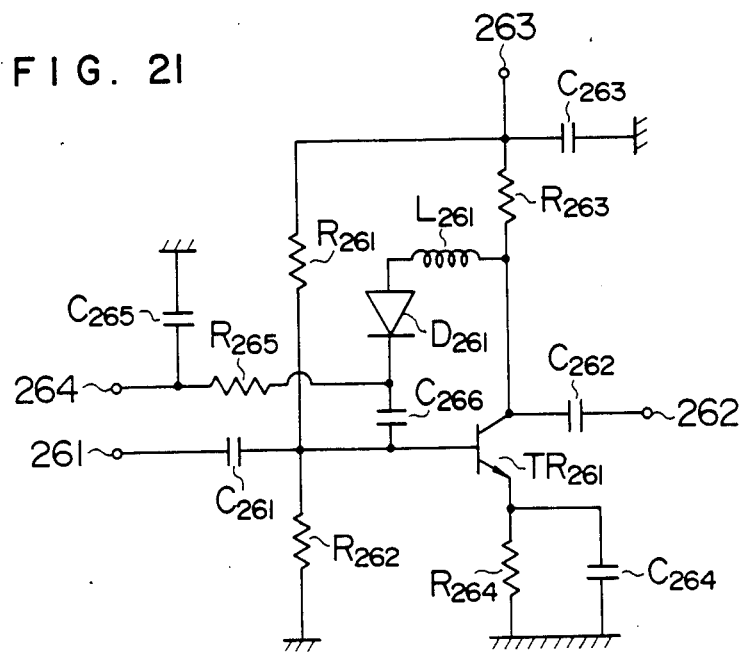

FIG. 21 shows a further embodiment of an analog frequency divider which constitutes a frequency synthesizer of the present invention. This embodiment shows an example of an analog frequency divider which employs a transistor. Numeral 261 designates a signal input terminal, 262 a frequency-divided output terminal, 263 a bias voltage setting power supply terminal, and 264 designates a control terminal. Between the base and collector of a transistor TR261, there is provided a feedback circuit consisting of an inductor L261, a capacitor C266, and a diode D261, and thus a frequency divider circuit is formed. Capacitors C261 and C262 are DC blocking capacitors, capacitors C263 to C265 are high frequency bypass capacitors, resistors R261 to R264 are bias resistors for biasing the transistor TR261, and a resistor R265 supplies the output voltage of the loop filter to the diode D261. In the embodiment, the diode across the base and collector of the transistor TR261 is utilized, and a similar frequency dividing characteristic can be obtained as is the case in which the diode is used as described in the foregoing.

Figure 22:
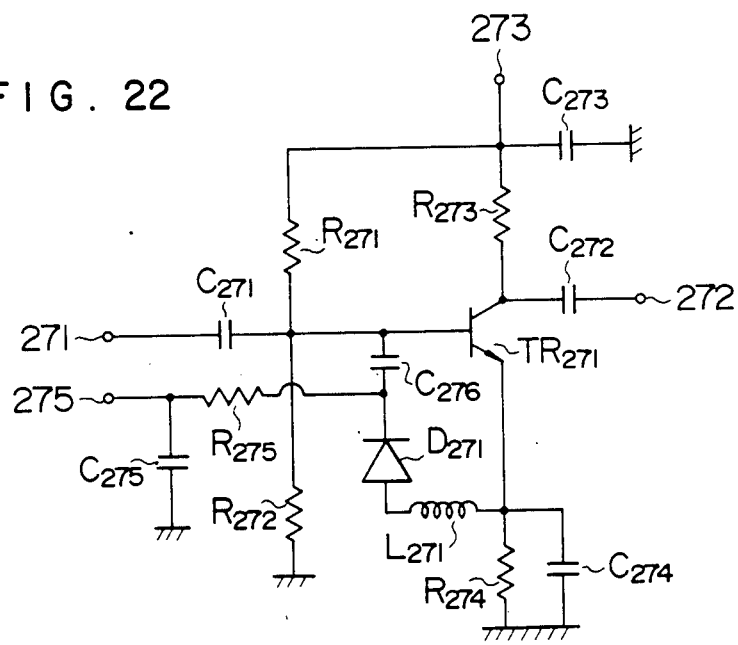

FIG. 22 shows a further embodiment of an analog frequency divider which constitutes a frequency synthesizer of the present invention. Numeral 271 designates a signal input terminal, 272 a frequency-divided output terminal, and 273 designates a bias voltage setting power supply terminal. The manner of connection of respective terminals is the same as in FIG. 18. Between the base and emitter of a transistor TR271, there is provided a feedback circuit consisting of an inductor L271, a capacitor C276, and a diode D271, and thus a frequency divider circuit is formed. Capacitors C271 and C272 are DC blocking capacitors, capacitors C273 to C275 are high frequency bypass capacitors, resistors R271 to R274 are bias resistors for biasing the transistor TR271, and a resistor R275 supplies the output voltage of the loop filter to the diode D271. The embodiment utilizes a diode between the base and emitter of the transistor TR271, and a similar frequency dividing characteristic is obtained as is the case in which the diode is used as described in the foregoing.

Further, in the embodiment, an example of using the NPN type transistor is described, however, it is apparent that a PNP type transistor may be used.

For such an analog frequency divider, a similar characteristic is obtained even when a diode is used, or a transistor is used.

Furthermore, in the embodiments of the analog frequency divider described hereinbefore, examples of the binary frequency divider are described. However, by arranging these frequency dividers in an N-stage cascade connection, a frequency divider for obtaining a frequency of $(\frac{1}{2})^N$ the input frequency is provided.

Figure 23:
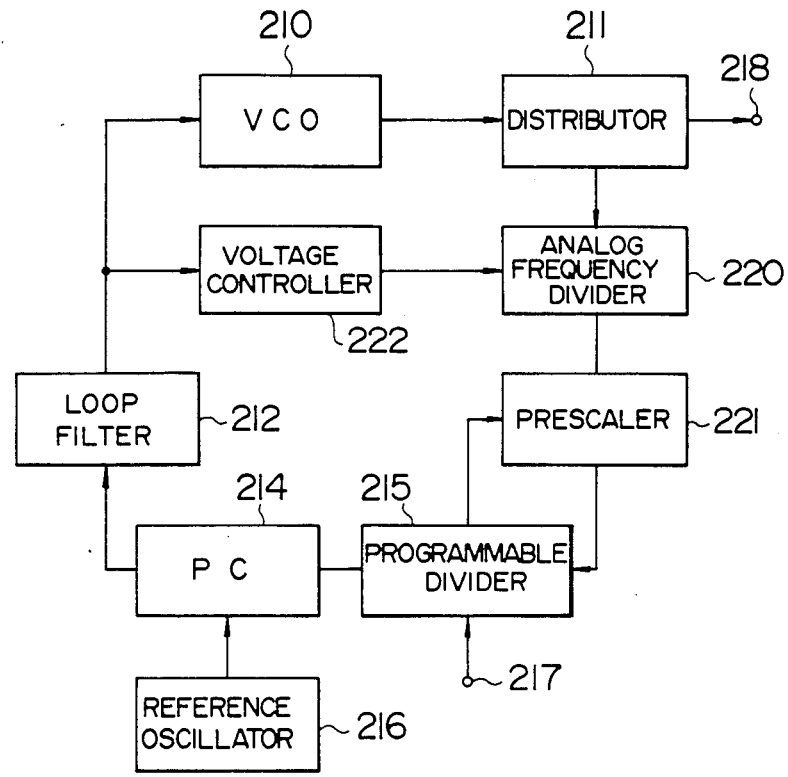
FIG. 23 is a block diagram of another embodiment of a frequency synthesizer according to the present invention.

FIG. 23 shows a block diagram of a synthesizer of the present invention, and identical portions to that in FIG. 17 are allocated identical reference numerals. The description as to these portions are omitted since their operations are identical to that in FIG. 17. From the output of a PC214 proportional to a phase difference between two signals applied thereto, AC components are removed by a loop filter 212, and then applied to a VCO 210 and to a voltage controller 222. The output voltage of the loop filter 212 is determined by a frequency setting signal applied to a terminal 217, and the oscillation frequency of the VCO 210 is varied. Further, in an analog frequency divider 220, when the bias voltage is varied depending on the input frequency so that the bias voltage becomes low as the input frequency increases, the frequency dividing operation band can be widened. Accordingly, by providing the voltage controller 222 which operates to vary the bias voltage of the analog frequency divider 220 depending on the output voltage of the loop filter 212, a frequency synthesizer operable over a wide band with small power consumption can be realized.

Figure 24:
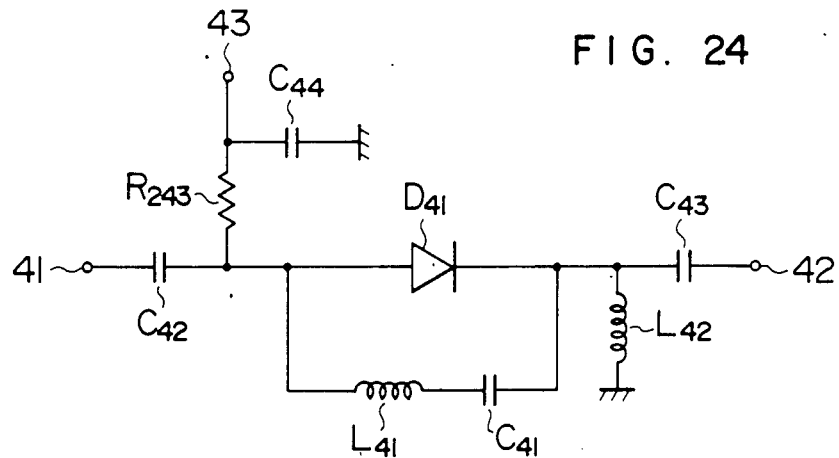
FIGS. 24 and 25 are circuit diagrams of other embodiments of an analog frequency divider circuit in the frequency synthesizer of FIG. 23.
Figure 25:
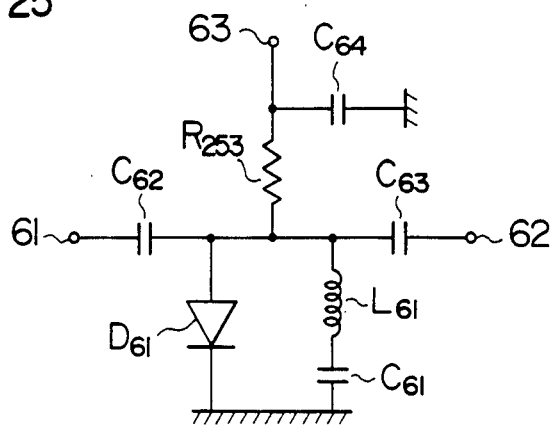

As the analog frequency divider 220, any one shown in FIGS. 4, 7, 10, 11, 13, 15 or 16 can be used. Further, various modifications are possible to the analog frequency divider, for example, the bias supply section in the configuration of FIG. 4 is replaced by a resistor R243 as shown in FIG. 24 thereby to achieve a simplified configuration, or the bias supply section in the configuration of FIG. 7 is replaced by a resistor R253 as shown in FIG. 25 thereby to simplify the constitution.

Figure 26:
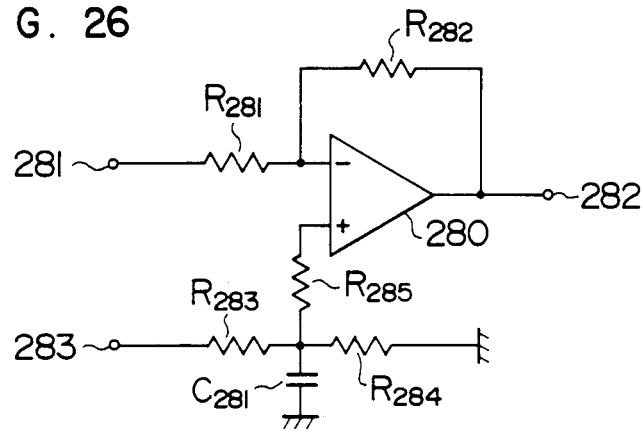
FIG. 26 is a circuit diagram of an embodiment of a voltage control unit section in the frequency synthesizer of FIG. 23.

FIG. 26 shows an embodiment of the voltage controller 222 in the frequency synthesizer of FIG. 23. Numeral 281 designates a terminal to which the output of the loop filter 212 is applied, 282 a bias supply terminal to the analog frequency divider 220, and 283 designates an offset voltage control terminal. The offset voltage of the bias supply terminal 282 connected to the analog frequency divider 220 is determined by a voltage applied to the control terminal 283 and by the resistors R283 and R284, and the voltage appearing at the junction of resistors R283 and R284 is applied to the positive input terminal (+) of an operational amplifier 280 through a resistor R285. A capacitor C281 is a high frequency bypass capacitor. The output voltage of the loop filter 212 inputted to the terminal 281 is voltage converted in accordance with the resistance ratio between the resistors R281 and R282, and then subtracted from the offset voltage and appears at the terminal 282.

By varying the bias voltage of the analog frequency divider 220 depending on the input frequency so that the bias voltage becomes low as the input frequency increases, a wide operating range can be realized. Further, since the output voltage of the loop filter 212 becomes high as the oscillation frequency of the VCO 210 increases, that is, the input frequency of the analog frequency divider 220 increases, by employing the voltage controller as shown in FIG. 26, the bias voltage can be varied so that the bias voltage becomes low as the input frequency increases. Therefore, a synthesizer operable stably over a wide band can be realized.

Figure 27:
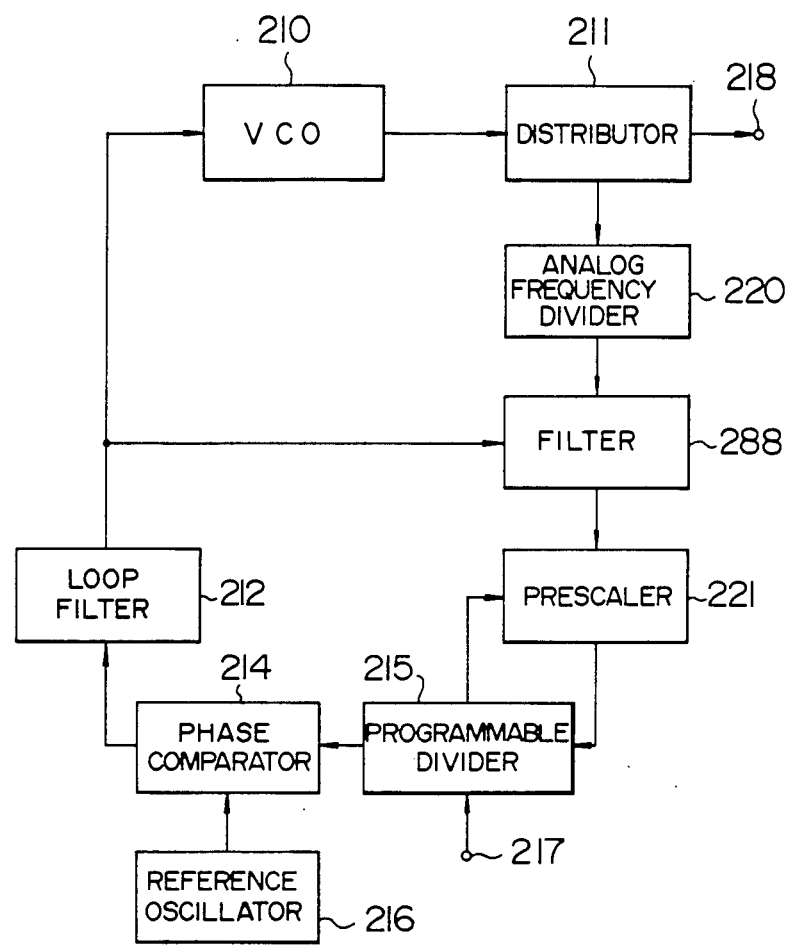
FIG. 27 is a block diagram of still another embodiment of a frequency synthesizer according to the present invention.

FIG. 27 shows a block diagram of an embodiment of a frequency synthesizer of the present invention. Identical reference numerals are used for members which are identical to those in FIG. 17.

The output of a VCO 210 is divided into two signals and distributed respectively to an output terminal 218 and to an analog frequency divider 220. A filter 288 is used to eliminate the input frequency, that is, the oscillation frequency of a VCO 210, and a frequency response is varied by the output of a loop filter 212. Since the analog frequency divider 220 operates at high speeds with small power consumption, a prescaler 221 can eliminate a frequency divider which operates at high speeds with large power consumption, and thus it is possible to attain the reduction of power consumption to a great extent. The output of the prescaler 221 is frequency divided further by a programmable divider 215 which frequency divides in accordance with a frequency setting signal applied to a terminal 217, and then the resultant signal is phase compared in a PC 214 with the output of a reference oscillator 216 such as a temperature compensation type crystal oscillator. From the output of the PC 214 proportional to a phase difference between these two signals, AC components are removed by the loop filter 212, and then applied to the VCO 210 and to the filter 288. The output voltage of the loop filter 212 is determined by the frequency dividing number control signal applied to the terminal 217, and the oscillation frequency of the VCO 210 is varied by the output of the loop filter 212. Although the analog frequency divider 220 operates with small power consumption, the input frequency, that is, the oscillation frequency of the VCO 210 leaks. When the oscillation range of the VCO 210 is a narrow band, it will be sufficient by adding a fixed filter (for example, a lowpass filter or a bandpass filter) after the analog frequency divider 220, however, when the oscillation range varies over more than an octave, it will be difficult to remove the input frequency by the fixed filter. For this reason, a filter 288 whose frequency response varies depending on the output voltage of the loop filter 212 is provided. By attenuating the input frequency in this manner, a frequency synthesizer which is operable stably over a wide band and dissipates small power can be realized.

As a concrete structure of the analog frequency divider 220 in this embodiment, anyone shown in FIGS. 4, 13, 15, 24 or 25 may be used.

Figure 28:
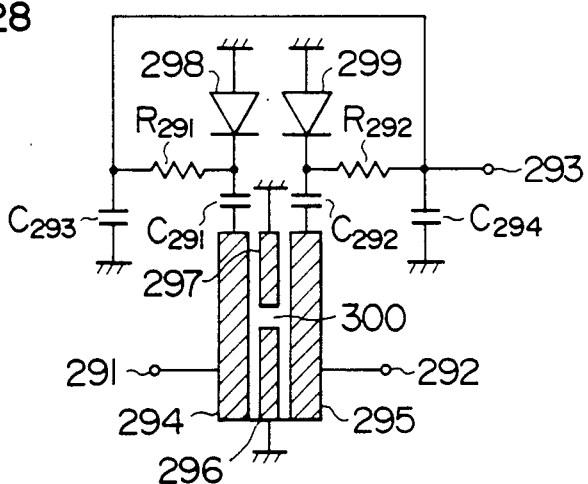
FIG. 28 is a circuit diagram of an embodiment of a filter section of the frequency synthesizer of FIG. 27.

FIG. 28 shows an embodiment of the filter 288 which is comprised in the frequency synthesizer of FIG. 27. Numerals 291 and 292 designate input and output terminals respectively, and 293 designates a control terminal. The input terminal 291 is connected to the output of the analog frequency divider 220 of FIG. 27, and the output terminal 292 is connected to the prescaler 221 (FIG. 27), and the control terminal 293 is connected to the output of the loop filter 212 (FIG. 27). The input terminal 291 and output terminal 292 are respectively coupled with resonators 294 and 295 by a tap coupling. Furthermore, an inter-stage coupling is determined by the size of an opening coupling section 300 which is controlled by grounding sections 296 and 297. The resonators 294 and 295 form a resonance circuit with capacitors C291 and C292, and variable capacity elements 298 and 299 such as varactors. The resonance frequency of this resonance circuit is controlled by the output voltage of the loop filter 212 which is applied from the control terminal 293 through resistors R291 and R292. Capacitors C291 and C292 are high frequency bypass capacitors. In the analog frequency divider 220, although it operates with small power consumption, the input frequency leaks to the output side. For this reason, when the operating range is a wide band extending over an octave,, the maximum operating frequency to be frequency divided by the succeeding stage prescaler 221 becomes higher than the lower limit frequency of the operating range. Thus, in the frequency near the lower limit, unless the input frequency component is removed before inputting to the prescaler 221, frequency dividable two frequencies will be inputted and proper operation will not be performed. In order to avoid such a situation, if the frequency response of the filter 221 is continually adapted to a frequency to be frequency divided by the analog frequency divider 220, the input frequency of the analog frequency divider 220 will be attenuated, and thus the level of this input frequency can be lowered below the level of the input sensitivity of the prescaler 221. Therefor, a synthesizer operable stably over a wide band can be realized. In this embodiment, although the description is made as to an example of the filter 288 in which it has two stages, input and output couplings of tap coupling, and inter-stage coupling of opening section coupling, it should be appreciated that the configuration of the filter 288 is not limited to these examples.

Furthermore, in the foregoing, the analog frequency divider is described as to an example in which the frequency dividing number is 2 (an integral submultiple is $\frac{1}{2}$). However, when the analog frequency dividers are connected in an N-stage cascade connection to frequency divide by $(2)^N$ (an integral submultiple $(\frac{1}{2})^N$), by inserting the filter 288 before the second stage analog frequency divider or a prescaler, the frequency dividing operation can be achieved satisfactorily.

FIGS. 29 to 33 show embodiments of the frequency divider circuit of the present invention including means for compensating temperature fluctuation of the frequency dividing diode.

Figure 29:
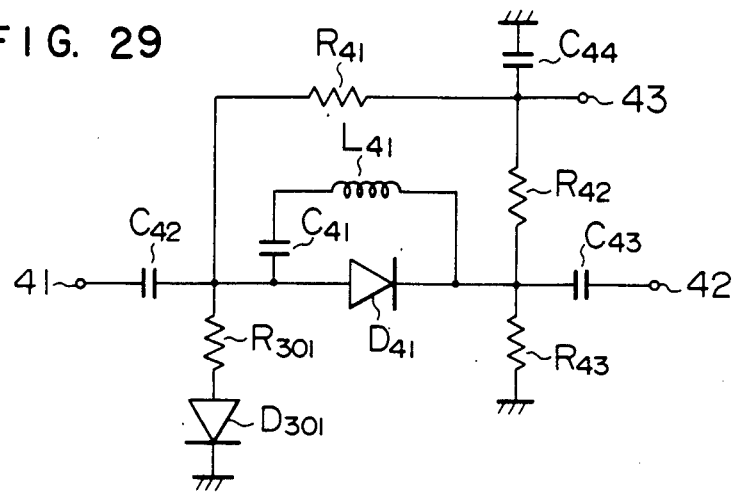
FIGS. 29 to 33 are circuit diagrams of still other embodiments of an analog frequency divider circuit according to the present invention.

Referring to FIG. 29, a series circuit of a resistor $R_{301}$ and a cathode grounded diode $D_{301}$ for supplying bias voltage is connected to the anode of the diode $D_{41}$. Other portions of FIG. 29 are the same as those of FIG. 4. The forward characteristic of the frequency dividing diode $D_{41}$ is usually fluctuated by temperature variation. The diode $D_{301}$ varies the anode voltage of the diode $D_{41}$ in accordance with temperature characteristic of the diode $D_{301}$ in such a manner that the anode bias voltage of the diode $D_{41}$ is lowered when the temperature rises, and heightened when the temperature falls.

Figure 30:
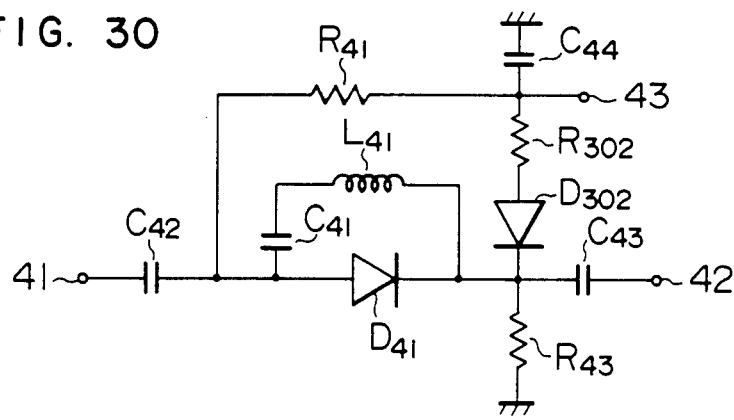

Referring to FIG. 30, a series circuit of a resistor $R_{302}$ and a diode $D_{302}$ is connected between a power supply terminal 43 and the cathode of the diode $D_{41}$. Other portions are the same as those of FIG. 4. In this embodiment, cathode bias voltage of the diode $D_{41}$ is regulated in accordance with the temperature characteristic of the diode $D_{302}$.

Figure 31:
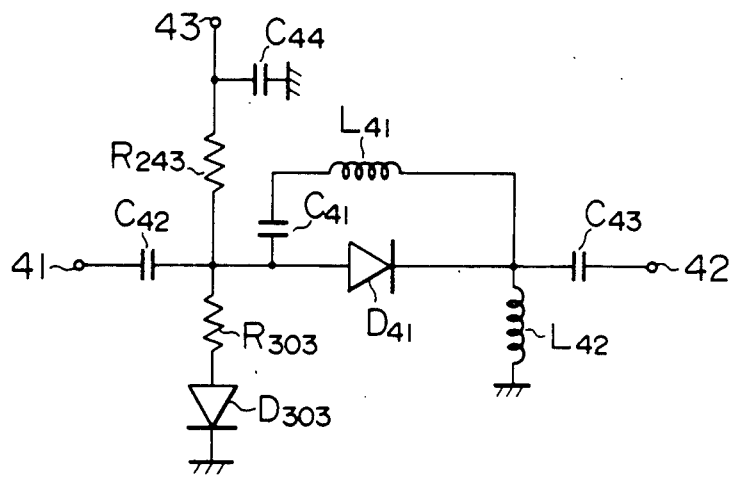

Referring to FIG. 31, a modified frequency divider circuit of FIG. 24 is shown. A series circuit of a resistor $R_{303}$ and a diode $D_{303}$, the cathode thereof is grounded, is connected to the anode of the diode $D_{41}$. Other portions are the same as those of FIG. 24. In this embodiment, the anode voltage of the diode $D_{41}$ is regulated in accordance with the temperature characteristic of the diode $D_{303}$.

Figure 32:
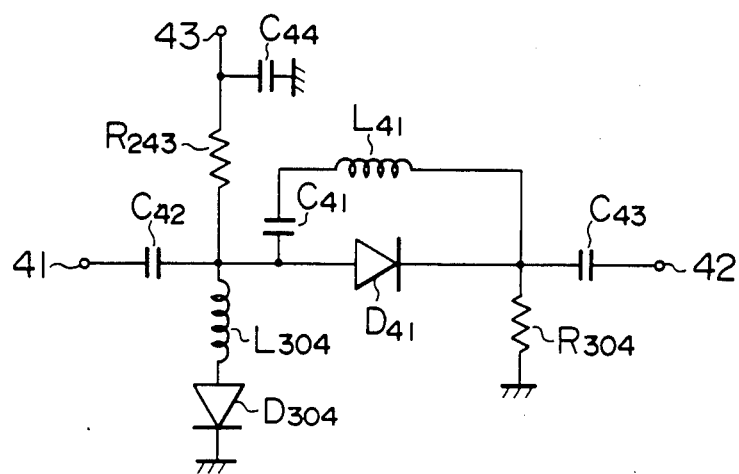

Referring now to FIG. 32, modification of the circuit of FIG. 31 is illustrated. In this embodiment, a series circuit of a choke coil $L_{304}$ and a diode $D_{304}$ is connected to the anode of the diode $D_{41}$ and a resistor $R_{304}$ is connected between the cathode of the diode $D_{41}$ and ground. In this embodiment, the anode voltage of the diode $D_{41}$ is regulated in accordance with the temperature characteristic of the diode $D_{304}$. In addition to this, it is possible, in this embodiment, to compensate for voltage fluctuations of the power supply by the clamping operation of the diode $D_{304}$.

Figure 33:
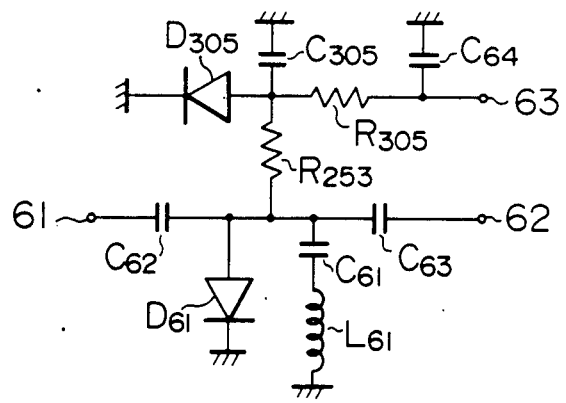

Referring now to FIG. 33, a modified frequency divider circuit of FIG. 25 is shown. A series circuit of a resistor $R_{305}$ and a diode $D_{305}$ is connected between the power supply terminal 63 and ground. The mid point of the series circuit is connected to the resistor $R_{253}$ and a condenser $C_{305}$ for bypassing higher harmonics is connected thereto. Other portions the same as those of FIG. 25. This embodiment is possible to compensate both for temperature fluctuation of the frequency dividing diode $D_{61}$ and voltage fluctuation of the power supply, similarly to the embodiment of FIG. 32.

What is claimed is:

1. A frequency synthesizer comprising:
   a voltage-controlled oscillator oscillating at a frequency corresponding to an input voltage;
   a first analog frequency divider for frequency dividing an output of said oscillator;
   a second frequency divider for frequency dividing an output of said first frequency divider;
   a phase comparator for comparing an output of said second frequency divider with an output of a reference oscillator and for generating an output proportional to a phase difference between the output of said second frequency divider and the output of said reference oscillator; and a loop filter for eliminating an AC component from the output of said phase comparator, an output of said loop filter being applied to said voltage-controlled oscillator and to said analog frequency divider.

2. A frequency synthesizer according to claim 1, wherein said analog frequency divider includes
a diode,
a feedback circuit connected in parallel with said diode, said feedback circuit having an inductor, capacitor, and a variable capacity diode,
a control terminal for applying the output from said loop filter to said variable capacity diode, and
a bias circuit for biasing said diode.

3. A frequency synthesizer according to claim 1, wherein said analog frequency divider includes
a transistor,
a feedback circuit added between the base and the collector of said transistor, said feedback circuit having an inductor, a capacitor, and a variable capacity diode,
a control terminal for applying the output from said loop filter to said variable capacity diode, and
a bias circuit for biasing said transistor.

4. A frequency synthesizer according to claim 1, wherein said analog frequency divider includes
a transistor,
a feedback circuit added between the base and the emitter of said transistor, said feedback circuit having an inductor, a capacitor, and a variable capacity diode,
a control terminal for applying the output from said loop filter to said variable capacity diode, and
a bias circuit for biasing said transistor.

5. A frequency synthesizer comprising
a voltage-controlled oscillator oscillating at a frequency corresponding to an input voltage;
a first frequency divider for frequency dividing an output of said oscillator;
a second frequency divider for frequency dividing an output of said first frequency divider;
a phase comparator for comparing an output of said second frequency divider with an output of a reference oscillator and for generating an output proportional to a phase difference between the output of said second frequency divider and the output of said reference oscillator;
a loop filter for eliminating an AC component from the output of said phase comparator, an output of said loop filter being applied to said voltage controlled oscillator and to said analog frequency divider; and
means for making a bias voltage of said first frequency divider variable, wherein the output of said loop filter is applied to said first frequency divider through said means for making a bias voltage variable.

6. A frequency synthesizer according to claim 5, wherein said analog frequency divider includes
a diode,
a feedback circuit connected in parallel with said diode, said feedback circuit having a capacitor and an inductor, and
a bias circuit for biasing said diode.

7. A frequency synthesizer according to claim 5, wherein said analog frequency divider includes
a transistor,
a feedback circuit added between the base and the collector of said transistor, said feedback circuit having a capacitor and an inductor, and
a bias circuit for biasing said transistor.

8. A frequency synthesizer according to claim 5, wherein said analog frequency divider includes
a transistor,
a feedback circuit added between the base and the emitter of said transistor, said feedback circuit having a capacitor and an inductor, and
a bias circuit for biasing said transistor.

9. A frequency synthesizer according to claim 5, wherein said means for making a bias voltage variable includes an operational amplifier.

10. A frequency synthesizer comprising:
a voltage-controlled oscillator oscillating at a frequency corresponding to an input voltage;
an analog frequency divider for frequency dividing an output of said oscillator;
a filter for eliminating leakage of an input frequency from an output of said analog frequency divider;
a further frequency divider for further frequency dividing an output of said filter;
a phase comparator for comparing an output of said further frequency divider with an output of a reference oscillator and for generating an output proportional to a phase difference between the output of said further frequency divider and the output of said reference oscillator;
a loop filter for eliminating an AC component from the output of said phase comparator; and
means for making a frequency response of said filter variable by an output of said loop filter.

11. A frequency synthesizer according to claim 10, wherein said analog frequency divider includes
a diode,
a feedback circuit connected in parallel with said diode, said feedback circuit having a capacitor and an inductor, and
a bias circuit for biasing said diode.

12. A frequency synthesizer according to claim 10, wherein said analog frequency divider includes
a transistor,
a feedback circuit added between the base and the collector of said transistor, said feedback circuit having a capacitor and an inductor, and
a bias circuit for biasing said transistor.

13. A frequency synthesizer according to claim 10, wherein said analog frequency divider includes
a transistor,
a feedback circuit added between the base and the emitter of said transistor, said feedback circuit having a capacitor and an inductor, and
a bias circuit for biasing said transistor.

14. A frequency synthesizer according to claim 10, wherein said means for making a frequency response variable includes a varactor diode.

* * * * *